US011394101B2

(12) United States Patent
Knopik et al.

(10) Patent No.: US 11,394,101 B2
(45) Date of Patent: Jul. 19, 2022

(54) METHOD AND DEVICE FOR CALIBRATING A HYBRID COUPLER

(71) Applicant: STMicroelectronics SA, Montrouge (FR)

(72) Inventors: Vincent Knopik, Crets en Belledonne (FR); Jeremie Forest, Villard Bonnot (FR); Eric Kerherve, Pessac (FR)

(73) Assignee: STMicroelectronics SA, Montrouge (FR)

(*) Notice: Subject to any disclaimer, the term of this patent is extended or adjusted under 35 U.S.C. 154(b) by 97 days.

(21) Appl. No.: 16/764,947

(22) PCT Filed: Nov. 21, 2017

(86) PCT No.: PCT/FR2017/053194
§ 371 (c)(1),
(2) Date: May 18, 2020

(87) PCT Pub. No.: WO2019/102075
PCT Pub. Date: May 31, 2019

(65) Prior Publication Data
US 2020/0350653 A1    Nov. 5, 2020

(51) Int. Cl.
*H01P 5/22*        (2006.01)
*H04B 17/21*       (2015.01)
(Continued)

(52) U.S. Cl.
CPC .......... *H01P 5/227* (2013.01); *H01L 23/5223* (2013.01); *H03H 11/16* (2013.01); *H04B 17/21* (2015.01)

(58) Field of Classification Search
CPC ..... H01P 5/227; H04B 17/21; H01L 23/5223; H03H 11/16
See application file for complete search history.

(56) References Cited

U.S. PATENT DOCUMENTS 9,190,979 B2 * 11/2015 Granger-Jones ........ H04L 5/143
10,735,045 B2 *  8/2020 Khlat ..................... H03H 7/463

FOREIGN PATENT DOCUMENTS

CN      204442340 U    7/2015
CN      205883201 U    1/2017
(Continued)

OTHER PUBLICATIONS

First Office Action and Search Report for co-pending CN Appl. No. 201780097081.3 dated Aug. 30, 2021 (8 pages).
(Continued)

*Primary Examiner* — Stephen E. Jones
*Assistant Examiner* — Kimberly E Glenn
(74) *Attorney, Agent, or Firm* — Crowe & Dunlevy

(57) ABSTRACT

A hybrid coupler operating in a power divider mode includes two inputs, two outputs, a capacitive module coupled between the inputs and the outputs or on each input and each output. The capacitive module has an adjustable capacitive value making it possible to adjust the central frequency. A calibration method includes: delivering a first reference signal having a first reference frequency on the first input of the hybrid coupler, measuring the peak value of a first signal delivered to the first output of the coupler and measuring the peak value of a second signal delivered to the second output of the coupler. The two peak values are compared and an adjustment of the capacitive value of the capacitive module is made until an equality of the peak values is obtained to within a tolerance.

39 Claims, 5 Drawing Sheets

(51) Int. Cl.
   *H01L 23/522*   (2006.01)
   *H03H 11/16*   (2006.01)

(56) References Cited

FOREIGN PATENT DOCUMENTS

| | | | |
|---|---|---|---|
| CN | 106537769 | A | 3/2017 |
| EP | 1043800 | A1 | 10/2000 |
| JP | 2010021719 | A | 1/2010 |

OTHER PUBLICATIONS

Knopik Vincent et al: "Integrated Scalable and Tunable RF CMOS SOI Quadrature Hybrid Coupler", 2017, 12th European Microwave Integrated Circuits Conference (EUMIC) European Microwave Association, Oct. 8, 2017 pp. 159-162.
International Search Report and Written Opinion for PCT/FR2017/053194 dated Jul. 23, 2018 (18 pages).
EPO Search Report and Written Opinion for family-related EP Appl. No. 17821673.5, report dated May 2, 2022, 6 pgs.
Moret, Boris, et al: "A 28GHz Self-Contained Power Amplifier for 5G applications in 28nm FD-SOI CMOS," 2017, IEEE, 4 pgs.
Database WPI, Week 201563, Thomson Scientific, London, GB; AN 2015-52660E, & CN 204 442 340 U (Xu Y) Jul. 1, 2015, 1 pg.

\* cited by examiner

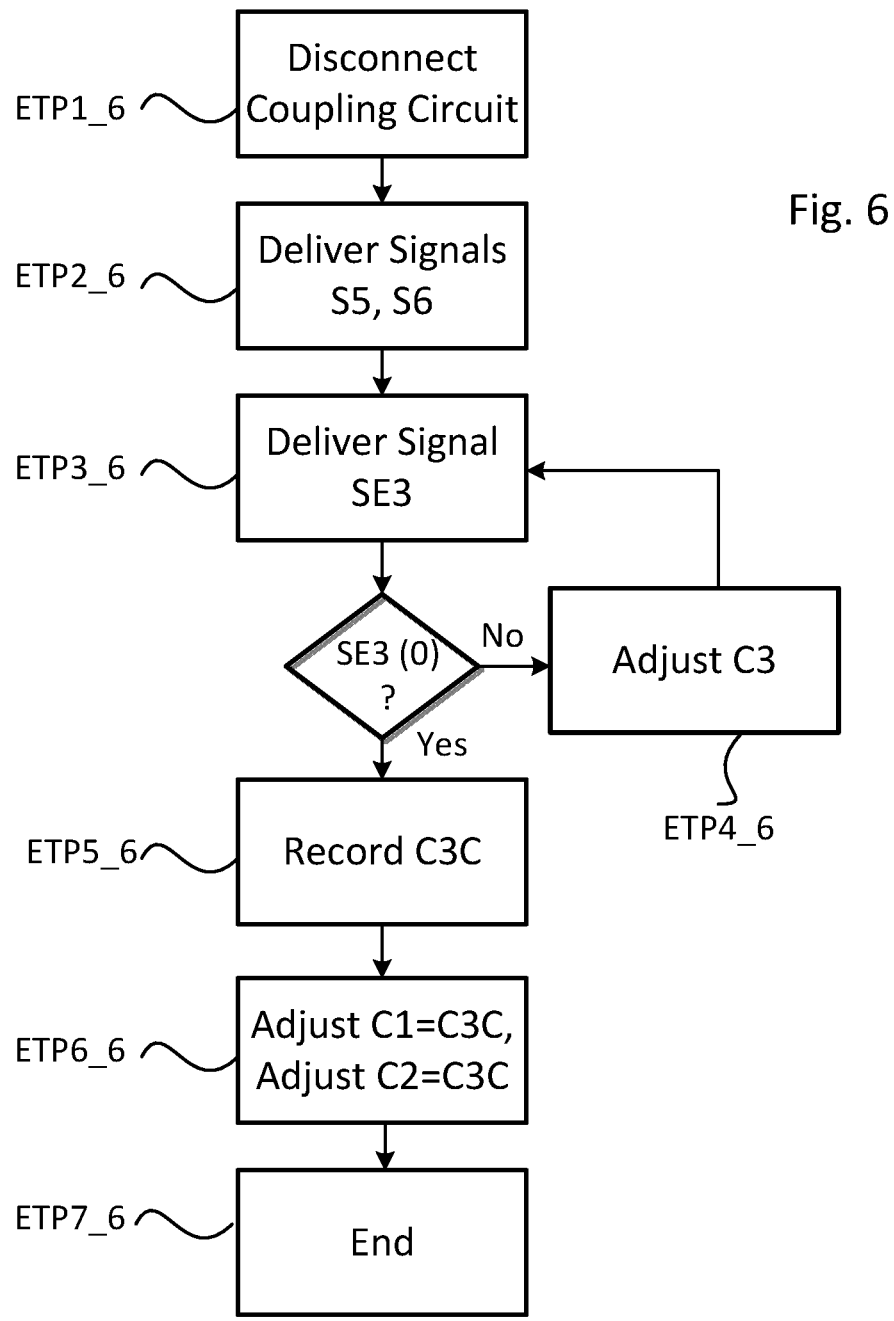

METHOD AND DEVICE FOR CALIBRATING A HYBRID COUPLER

PRIORITY CLAIM

This application is a 371 filing of PCT/FR2017/053194 filed Nov. 21, 2017, the disclosure of which is incorporated by reference in its entirety.

TECHNICAL FIELD

Implementations and embodiments relate to electronic devices, more particularly electronic devices comprising hybrid couplers ("hybrid couplers"), known to those skilled in the art for electromagnetic applications notably in the radio frequency field ("Radio Frequency", abbreviated RF).

BACKGROUND

A conventional hybrid coupler, more particularly a conventional quadrature hybrid coupler, or 90° hybrid coupler, generally comprises: a first input terminal, a second input terminal, called isolated, coupled to an impedance, for example of 50 ohms, when the coupler is operating in power divider mode, or called coupled when the coupler is operating in power combiner mode, or called direct when the coupler is operating in phase shifter mode, a first output terminal, called transmitted, and a second output terminal, called coupled when the coupler is operating in power divider mode and in phase shifter mode, or called isolated, connected to an impedance, for example of 50 ohms, when the coupler is operating in power combiner mode.

When the hybrid coupler is operating according to the power divider mode, the coupler is configured to receive an input signal on the first input terminal and to distribute, for example equally, the power of the input signal over the first and second output terminals. It is appropriate to note that signals delivered on the first and second output terminals comprise a phase shift, for example of 90 degrees.

When the hybrid coupler is operating according to the power combiner mode, the coupler is configured to receive a first input signal on the first input terminal and a second input signal having a phase shift, for example of 90 degrees, with respect to the first input signal, on the second input terminal called "coupled", and to deliver on the first output terminal the combination of the powers of the first and second input signals. The second output terminal called "isolated" is coupled to an impedance, for example of 50 ohms. It is appropriate to note that the power recombination at the first output terminal is constructive whilst the power recombination at the second output terminal is destructive because of the phase shift between the two input signals.

When the hybrid coupler is operating according to the phase shifter mode, the coupler is configured to receive an input signal on the first input terminal. The first and second output terminals of the coupler are respectively coupled to two variable complex impedances which are different from the reference impedance, for example of 50 ohms, of the coupler and involve a coefficient of reflection known to those skilled in the art.

The input signal received on the first input of the coupler passes through the coupler and is reflected at the first and second output terminals. The reflected signals again pass through the coupler and combine at the first and second input terminals. It is appropriate to note that the combination of the reflected signals at the first input terminal is destructive because they are in phase opposition and that the combination of the reflected signals at the second input terminal is constructive. The coupler is consequently configured for delivering to the second input terminal an output signal with an attenuation equal to the modulus of the coefficient of reflexion and a phase shift related to the angle of the coefficient of reflection.

In general, such a hybrid quadrature coupler is structurally very symmetrical. Any terminal can therefore be used as an input.

Such a hybrid coupler generally has a narrow bandwidth. Consequently, an adjustment of the central frequency of the hybrid coupler requires several adaptation circuits.

Moreover, the central frequency of the hybrid coupler can be influenced by an impact called the "corner" impact ("corner impact" being an English term) commonly known to those skilled in the art. This corner impact is generally related to the variations of methods of manufacturing the hybrid coupler.

Such a corner impact can result, in the worst of cases, in a variation that can reach 20%, or even more, of the central frequency of the hybrid coupler.

In this respect, when there is a difference between the frequency of the signal delivered to the first input terminal and the central frequency of the hybrid coupler due to the corner impact, a difference in the amplitudes of the signals delivered on the two output terminals can be observed.

This difference in amplitude has a negative effect on the performance of the hybrid coupler. If several hybrid couplers are incorporated in an electromagnetic system, the overall performance of the system can then be impacted considerably.

Thus, there is a need to propose a technical solution, of low complexity and having low energy consumption, making it possible to adjust, in a simple and preferably automatic manner, the central frequency of a hybrid coupler in accordance with a reference frequency whilst using an implementation on silicon compatible with all of the conventional technologies.

SUMMARY

According to one aspect, there is proposed a method for calibrating the central frequency of a hybrid coupler operating according to a power divider mode.

The hybrid coupler comprises two inputs, two outputs, a capacitive module coupled between the inputs and the outputs or on each input and each output. The capacitive module has an adjustable capacitive value making it possible to adjust the central frequency.

The method comprises: delivering a first reference signal having a first reference frequency on a first input of the said hybrid coupler; measuring a peak value (by a peak detector or by any type of amplitude detection) of a first signal delivered to a first output of the coupler and measuring a peak value of a second signal delivered to the second output of the coupler; comparing the two peak values and adjusting a capacitive value of the capacitive module until an equality of the peak values is obtained to within a tolerance.

The first and second signals are, for example, voltages.

In this case, by way of non-limiting example, it can be considered that two peak values are equal if their values differ by at most 5 to 10 mV.

Such a method advantageously makes it possible to calibrate the central frequency of the hybrid coupler without calculating the real central frequency of the hybrid coupler or the difference between the real central frequency and the first reference frequency.

Moreover, such a method advantageously allows a simple automation of the calibration of the hybrid coupler. More precisely, the central frequency of the hybrid coupler can be adjusted automatically to a chosen frequency, that is to say a reference frequency, for example by means of an algorithm.

As the hybrid coupler can also operate as a power combiner, a calibration method is also proposed for this operating mode.

In this respect and according to another aspect, there is proposed a method for calibrating the central frequency of a hybrid coupler operating according to a power combiner mode.

The hybrid coupler comprises two inputs, two outputs, a capacitive module coupled between the inputs and the outputs or on each input and each output. The capacitive module has an adjustable capacitive value making it possible to adjust the central frequency.

The method comprises: delivering a second signal having a second reference frequency on a first output of the said hybrid coupler; measuring the peak value of a first signal delivered to a first input of the coupler and of the peak value of a second signal delivered to the second input of the coupler; comparing the two peak values and adjusting the capacitive value of the capacitive module until an equality of the peak values is obtained to within a tolerance.

It is appropriate to note that the first output of the hybrid coupler is used here as an input of the power combiner and that the first and second inputs of the hybrid coupler are used as outputs of the power combiner.

According to another aspect, there is proposed a method for calibrating a hybrid coupler operating according to a phase shifter mode, the hybrid coupler comprising two inputs, two outputs, a capacitive module coupled between the inputs and the outputs or on each input and each output, the capacitive module having an adjustable capacitive value making it possible to adjust the central frequency. The method comprises: delivering a third reference signal having a third reference frequency on a first input of the said hybrid coupler; measuring the peak value of a first signal delivered to a first output of the coupler and measuring the peak value of a second signal delivered to the second input of the coupler; and comparing the two peak values and adjusting the capacitive value of the capacitive module until an equality of the peak values is obtained to within a tolerance.

According to another aspect, there is proposed a method for calibrating a structure comprising an input hybrid coupler operating in power divider mode, an output hybrid coupler operating in power combiner mode, and a disconnectable coupling circuit coupled between the two couplers. The method comprises: disconnecting the coupling circuit before a calibration such as defined above of the central frequency of the input hybrid coupler operating according to a power divider mode and a calibration such as defined above of the central frequency of the output hybrid coupler operating according to a power combiner mode.

According to another aspect, there is proposed a method for calibrating a structure comprising at least two hybrid couplers of identical structure and able to operate according to identical or different modes, and possibly one or more disconnectable coupling circuits coupled between certain of the at least two hybrid couplers. The method comprises: disconnecting the coupling circuit or circuits if they are present; performing a first calibration such as defined above of the central frequency of the input hybrid coupler operating according to a power divider mode or performing a calibration such as defined above of the central frequency of the output hybrid coupler operating according to a power combiner mode; recording of the capacitive value of the capacitive module of the hybrid coupler calibrated at the end of the first calibration; and adjusting the capacitive module or modules of the other coupler or couplers with that capacitive value, these other couplers then being considered as calibrated.

The hybrid coupler such as defined above can for example be a 90° hybrid coupler. According to another aspect, there is proposed an electronic device, comprising: a hybrid coupler operating according to a power divider mode and comprising two inputs, two outputs, a capacitive module coupled between the inputs and the outputs or on each input and each output, the capacitive module having an adjustable capacitive value making it possible to adjust the central frequency of the hybrid coupler, a first input of the said hybrid coupler being configured to receive a first reference signal having a first reference frequency; a measuring circuit configured for measuring the peak value of a first signal delivered to a first output of the coupler and the peak value of a second signal delivered to the second output of the coupler; and a processing circuit configured for comparing the two peak values and adjusting the capacitive value of the capacitive module until an equality of the peak values is obtained to within a tolerance.

According to another aspect, there is proposed an electronic device, comprising: a hybrid coupler operating according to a power combiner mode and comprising two inputs, two outputs, a capacitive module coupled between the inputs and the outputs or on each input and each output, the capacitive module having an adjustable capacitive value making it possible to adjust the central frequency of the hybrid coupler, a first output of the said hybrid coupler being configured to receive a second reference signal having a second reference frequency; a measuring circuit configured for measuring the peak value of a first signal delivered to a first input of the coupler and the peak value of a second signal delivered to the second input of the coupler; and a processing circuit configured for comparing the two peak values and adjusting the capacitive value of the capacitive module until an equality of the peak values is obtained to within a tolerance.

According to another aspect, there is proposed an electronic device comprising: a hybrid coupler operating according to a phase shifter mode and comprising two inputs, two outputs, a capacitive module coupled between the inputs and the outputs or on each input and each output, the capacitive module having an adjustable capacitive value making it possible to adjust the central frequency of the hybrid coupler, a first input of the said hybrid coupler being configured to receive a third reference signal having a third reference frequency; a measuring circuit configured for measuring the peak value of a first signal delivered to a first output of the coupler and the peak value of a second signal delivered to the second output of the coupler; and a processing circuit configured for comparing the two peak values and adjusting the capacitive value of the capacitive module until an equality of the peak values is obtained to within a tolerance.

According to one embodiment, the measuring circuit such as defined above comprises a first peak detector configured for measuring the peak value of the first signal and a second peak detector configured pour measuring the peak value of the second signal.

According to another embodiment, the processing circuit such as defined above comprises a comparison circuit configured for comparing the two peak values.

By way of non-limiting example, the comparing circuit can comprise an exclusive OR gate.

According to yet another embodiment, the capacitive module comprises several configurations each one corresponding to a different capacitive value. The capacitive module can also be of the switched capacitors type.

The electronic device such as defined above can, for example, be produced in an integrated manner.

According to another aspect, a structure is proposed. This structure comprises: an input electronic device such as defined above comprising a hybrid coupler operating according to a power divider mode; an output electronic device such as defined above comprising a hybrid coupler operating according to a power combiner mode; and a disconnectable coupling circuit coupled between the hybrid coupler of the input electronic device and the hybrid coupler of the output electronic device and configured for being disconnected before the input and output electronic devices are respectively configured for adjusting the central frequency of the corresponding hybrid coupler by adjusting the capacitive value of the corresponding capacitive module.

According to another aspect, there is proposed a structure comprising: at least two electronic devices such as defined above of identical structure and being able to operate according to identical or different modes; and one or more disconnectable coupling circuits coupled between certain of the at least two electronic devices and configured for being disconnected before the said at least two electronic devices are respectively configured for adjusting the central frequency of the corresponding hybrid coupler by adjusting the capacitive value of the corresponding capacitive module.

Any one of the at least two electronic devices is configured for recording the capacitive value of the capacitive module of that electronic device at the time of obtaining an equality of the peak values measured by the measuring circuit of that electronic device to within a tolerance.

The capacitive module or modules of the other electronic device or devices is or are configured for being adjusted with that capacitive value.

According to yet another aspect, there is proposed a communication device incorporating at least one structure such as defined above.

BRIEF DESCRIPTION OF THE DRAWINGS

Other advantages and features of the invention will become apparent on examination of the detailed description of implementations and embodiments that are in no way limiting and of the appended drawings in which:

FIG. 6 illustrates diagrammatically an example implementation of a method for calibrating the real central frequencies of the hybrid couplers.

DETAILED DESCRIPTION

Figure 1:
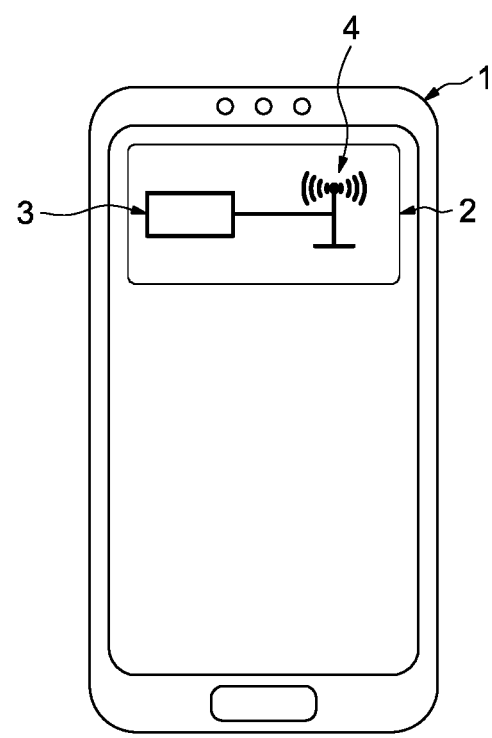
FIG. 1 shows a communication device.

FIG. 1 shows a communication device 1 such as a potable cell phone comprising at least one wireless communication system 2 which is, in this case, for example, a wireless communication system of the WiFi (standing for "Wireless Fidelity") type produced in an integrated manner.

The wireless communication system 2 comprises at least one transmission path 3. Each transmission path is coupled to a corresponding antenna 4.

For purposes of simplification, only one transmission path 3 is shown.

Figure 2:
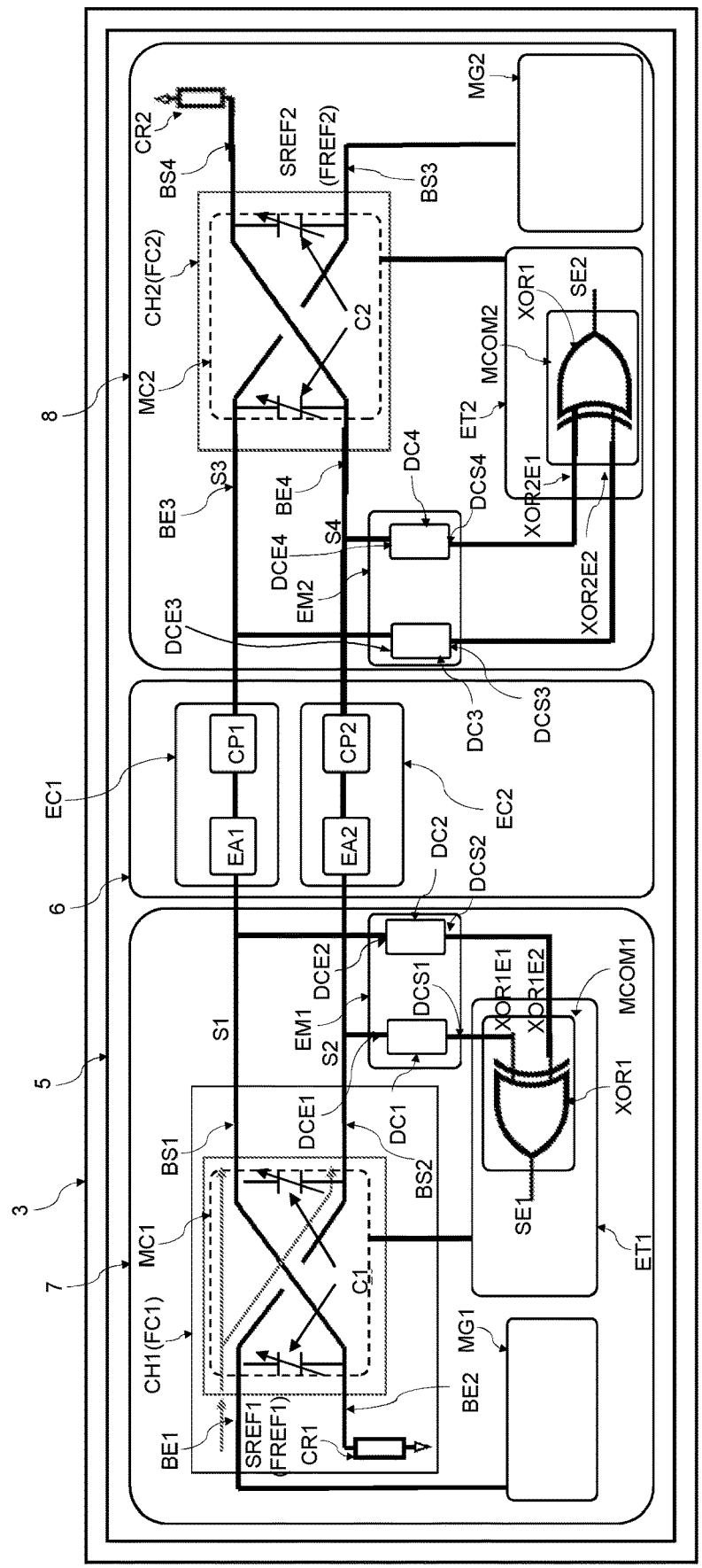
FIG. 2 illustrates an example embodiment of the transmission path.

Reference is now made to FIG. 2 in order to illustrate an example embodiment of the transmission path 3.

The transmission path 3 in this case comprises a structure 5 called balanced comprising a disconnectable coupling circuit 6 comprising a first and a second coupling module EC1 and EC2 coupled in parallel between an input electronic device 7 and an output electronic device 8.

The input electronic device 7 comprises a first generating circuit MG1, a first hybrid coupler CH1, a first measuring circuit EM1 and a first processing circuit ET1.

The first generating circuit MG1 is configured for delivering a first reference signal SREF1 having a first reference frequency FREF1.

The first hybrid coupler CH1, in this case for example a hybrid 90° quadrature coupler, comprises: a first input terminal BE1 coupled to the first generating circuit MG1 and configured to receive the first reference signal SREF1; a second input terminal BE2 coupled to a first resistive load CR1, in this case for example of 50 ohms; a first output terminal BS1 coupled to the first coupling module EC1; a second output terminal BS2 coupled to the second coupling module EC2; and a first capacitive module MC1 having a first adjustable capacitive value C1 and coupled between the first and second input terminals BE1, BE2 and the first and second output terminals BS1, BS2.

The first measuring circuit EM1 comprises: a first peak detector DC1 whose input DCE1 is coupled to the first output terminal BS1; and a second peak detector BS2 whose input DCE2 is coupled to the second output terminal BS2.

The first processing circuit ET1 is coupled to the first capacitive module MC1 and comprises a first comparison circuit MCOM1 comprising: a first exclusive OR gate XOR1 the first input XOR1E1 of which is coupled to the output DCS1 of the first peak detector DC1 and a second input XOR1E2 of which is coupled to the output DCS2 of the second peak detector DC2.

The electronic output device 8 comprises a second generating circuit MG2, a second hybrid coupler CH2, a second measuring circuit EM2, and a second processing circuit ET2.

The second generating circuit MG2 is configured for delivering a second reference signal SREF2 having a second reference frequency FREF2.

The first and second reference signals SREF1, SREF2 delivered by the first and second generating circuits MG1, MG2 can, for example, be identical or different.

The second hybrid coupler CH2 which, in this case, for example, is identical to the first hybrid coupler CH1, comprises: a third input terminal BE3 coupled to the second generating circuit MG2 and configured to receive the second reference signal SREF2; a fourth input terminal BE4 coupled to the second coupling module EC2; a third output terminal BS3 coupled to a second resistive load CR2, in this case for example of 50 ohms; a fourth output terminal BS4 coupled to the second signaling circuit ES2; and a second capacitive module MC2 having a second adjustable capacitive value C2 and coupled between the third and fourth input terminals BE3, BE4 and the third and fourth output terminals BS3, B S4.

It is appropriate to note that the first and second capacitive modules MC1, MC2 can also be coupled onto each input and each input and each output of the corresponding hybrid coupler CH1, CH2.

The second measuring circuit EM2 comprises: a third peak detector DC3 whose input DCE3 is coupled to the third input terminal BE3; and a fourth peak detector BS4 whose input DCE4 is coupled to the fourth input terminal BE4.

The second processing circuit ET2 is coupled to the second capacitive module MC2 and comprises a second comparing circuit MCOM2 comprising: a second exclusive OR gate XOR2 of which a first input XOR2E1 is coupled to the output DCS3 of the third peak detector DC3 and of which a second input XOR2E2 is coupled to the output DCS4 of the fourth peak detector DC4.

The first coupling module EC1 in this case comprises, for example, a first driver circuit EA1 and a first power controller CP1 coupled in series between the first output terminal BS1 and the third input terminal BE3.

The second coupling module EC2 comprises a second driver circuit EA2 and second power controller CP2 coupled in series between the second output terminal BS2 and the fourth input terminal BE4.

By way of non-limiting indication, the input hybrid coupler CH1 operates in power divider mode and the output hybrid coupler CH2 operates in power combiner mode.

Because of the possible variation of manufacturing methods and of the so-called corner impact mentioned above, the central frequencies FC1, FC2 of the input CH1 and output CH2 hybrid couplers are not always adapted for a better electromagnetic performance of the wireless communication system 2.

Figure 3:
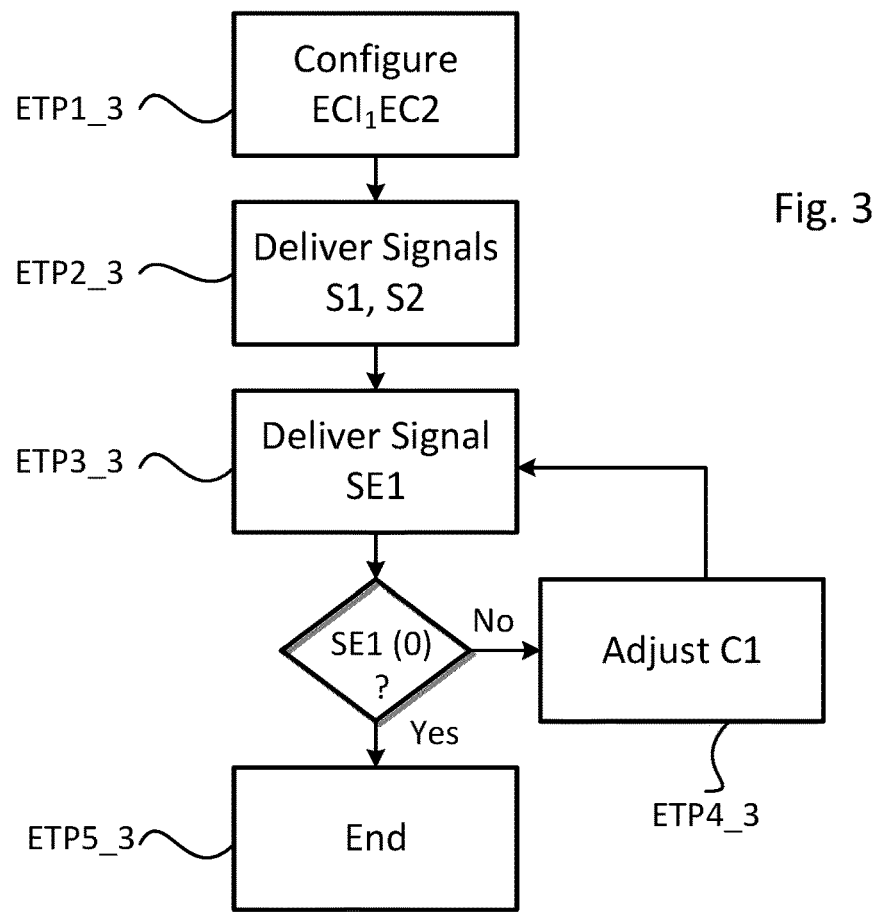
FIGS. 3 and 4 illustrate diagrammatically an example of implementation of a method for calibrating the central frequencies of the input and output hybrid couplers.
Figure 4:
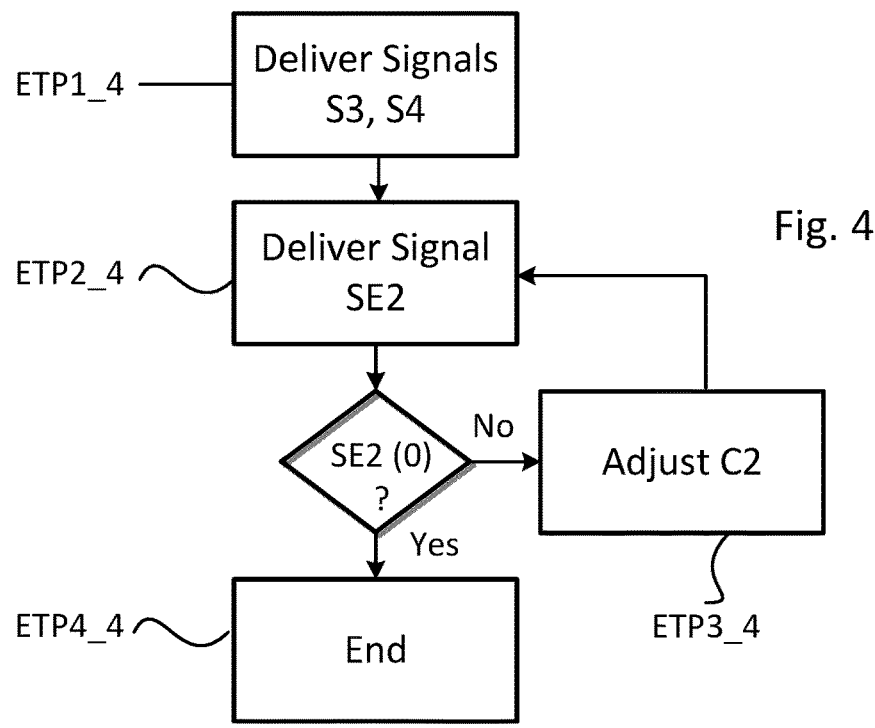

In this respect, reference is made to FIGS. 3 and 4 in order to illustrate diagrammatically an example of implementation of a method for calibrating the central frequencies FC1, FC2 of the input CH1 and output CH2 hybrid couplers.

By way of example, the calibration method begins with a phase of calibration of the central frequency FC1 of the input hybrid coupler CH1 as shown in FIG. 3.

In a step ETP1_3, the first and second coupling circuits EC1, EC2 of the coupling circuit 6 are configured for being disconnected in order to decouple the connection between the input CH1 and the output CH2 hybrid couplers.

It is appropriate to note that the calibration method can also begin with a phase of calibration of the central frequency FC2 of the output hybrid coupler CH2 as long as the coupling circuit 6 is always disconnected at the start of the said calibration phase.

Because of this, the calibration of the central frequency FC1 of the input hybrid coupler CH1 can be carried out without the possible influence of the output hybrid coupler CH2.

In a next step ETP2_3, the first generating circuit MG1 is configured for delivering, to the first input terminal BE1 of the input hybrid coupler CH1, a first reference signal SREF1 comprising a first reference frequency FREF1. This first reference frequency FREF1 can for example be equal to the nominal central frequency of the input hybrid coupler CH1.

On receiving the first reference signal SREF1 at the first input terminal BEL the input hybrid coupler CH1 is configured for delivering a first signal 51 to the first output terminal BS1 and a second signal S2 to the second output terminal B S2.

When the real central frequency FC1 of the input hybrid coupler CH1 is equal to the first reference frequency FREF1, the maximum amplitudes, in other words the peak values VC1, VC2 of the first and second signals 51, S2, are equal.

For this purpose, the first and second peak detectors DC1, DC2 are configured for detecting the said peak values VC1, VC2.

The circuits of the first and second peak detectors DC1, DC2 are commonly known to those skilled in the art and each peak detector DC1, DC2 can, for example, comprise a follower amplifier, a diode and a capacitor (not shown).

The first exclusive OR gate XOR1 of the first processing circuit ET1 is configured to receive the peak values VC1, VC2 of the first and second signals 51, S2.

When these peak values VC1, VC2 are different, the first exclusive OR gate XOR1 is configured for delivering a first calibration signal SE1 in its high state. This first calibration signal SE1 in fact serves to indicate the state of calibration of the real central frequency FC1 of the input hybrid coupler CH1 (ETP3_3).

In order to align the real central frequency FC1 of the input hybrid coupler CH1 and the first reference frequency FREF1 to within a tolerance, for example of 5 to 10 mV, the first processing circuit ET1 is moreover configured pour adjusting in a step ETP4_3 the first capacitive value C1 of the first capacitive module MC1 in such a way as to vary the real central frequency FC1 of the input hybrid coupler CH1.

The adjustment ETP4_3 of the capacitive value C1 is carried out if the first calibration signal SE1 is in its high state and ends when the first calibration signal SE1 is in its low state (ETP5_3). In this latter case, the real central frequency FC1 of the input hybrid coupler CH1 is equal to the first reference frequency FREF1 to within the tolerance.

Thus, a method is obtained making it possible to calibrate in an automated manner the real central frequency FC1 of the input hybrid coupler CH1 by monitoring the result SE1 of the comparison between the peak values VC1, VC2 of the first and second signals 51, S2.

FIG. 4 is a diagrammatic illustration of a phase of calibration of the real central frequency FC2 of the output hybrid coupler CH2 which, in this case, for example, follows the phase of calibration of the central frequency FC1 of the input hybrid coupler CH1 as illustrated above.

As the first and second coupling modules EC1, EC2 are already disconnected in the phase of calibration of the central frequency FC1 of the input hybrid coupler CH1, it is not necessary to repeat a disconnection of the first and second coupling modules EC1, EC2.

In a step ETP1_4, the second generating circuit MG2 is configured for delivering, to the third output terminal BS3 of the output hybrid coupler CH2, a second reference signal SREF2 comprising a second reference frequency FREF2.

It is appropriate to note that the first and second reference signals SREF1 and SREF2 generated by the first and second generating circuits MG1 and MG2 can be identical or different with regard to the phase or the amplitude while retaining the same reference frequency.

On receiving the second reference signal SREF2 at the third output terminal B S3, the output hybrid coupler CH2 is configured for delivering a third signal S3 to the third input terminal BE3 and a fourth signal S4 to the fourth input terminal BE4.

When the real central frequency FC2 of the output hybrid coupler CH2 is equal to the second reference frequency FREF2, the maximum amplitudes, in other words the peak values VC3, VC4 of the third and fourth signals S3, S4 are equal.

Thus, the third and fourth peak detectors DC3, DC4 are configured for detecting the said peak values VC3, VC4.

The circuits of the third and fourth peak detectors DC3, DC4 can be identical to those of the first and second peak detectors DC1, DC2 and are commonly known to those skilled in the art.

The second exclusive OR gate XOR2 of the second processing circuit ET2 is configured to receive the peak values VC3, VC4 of the third and fourth signals S3, S4.

When these peak values VC3, VC4 are different, the second exclusive OR gate XOR2 is configured for delivering a second calibration signal SE2 in its high state. This second calibration signal SE2 effectively serves to indicate the state of calibration of the real central frequency FC2 of the output hybrid coupler CH2 (ETP2_4).

In order to align the real central frequency FC2 of the output hybrid coupler CH2 and the second reference frequency FREF2 to within the measuring tolerance, the second processing circuit ET2 is moreover configured for adjusting, in a step ETP3_4, the second capacitive value C2 of the second capacitive module MC2 in such a way as to vary the real central frequency FC2 of the output hybrid coupler CH2.

The adjustment ETP3_4 of the capacitive value C2 is carried out if the second calibration signal SE2 is in its high state and ends when the second calibration signal SE2 is in its low state ETP4_4, in other words the real central frequency FC2 of the output hybrid coupler CH2 is equal to the second reference frequency FREF2.

By way of example, the first and second processing circuits ET1, ET2 can be implemented in the form of software in a microprocessor known to those skilled in the art.

Thus, it is also possible to calibrate the real central frequency FC2 of the output hybrid coupler CH2 in an automated manner by monitoring the result SE2 of the comparison between the peak values VC3, VC4 of the third and fourth signals S3, S4.

Figure 5:
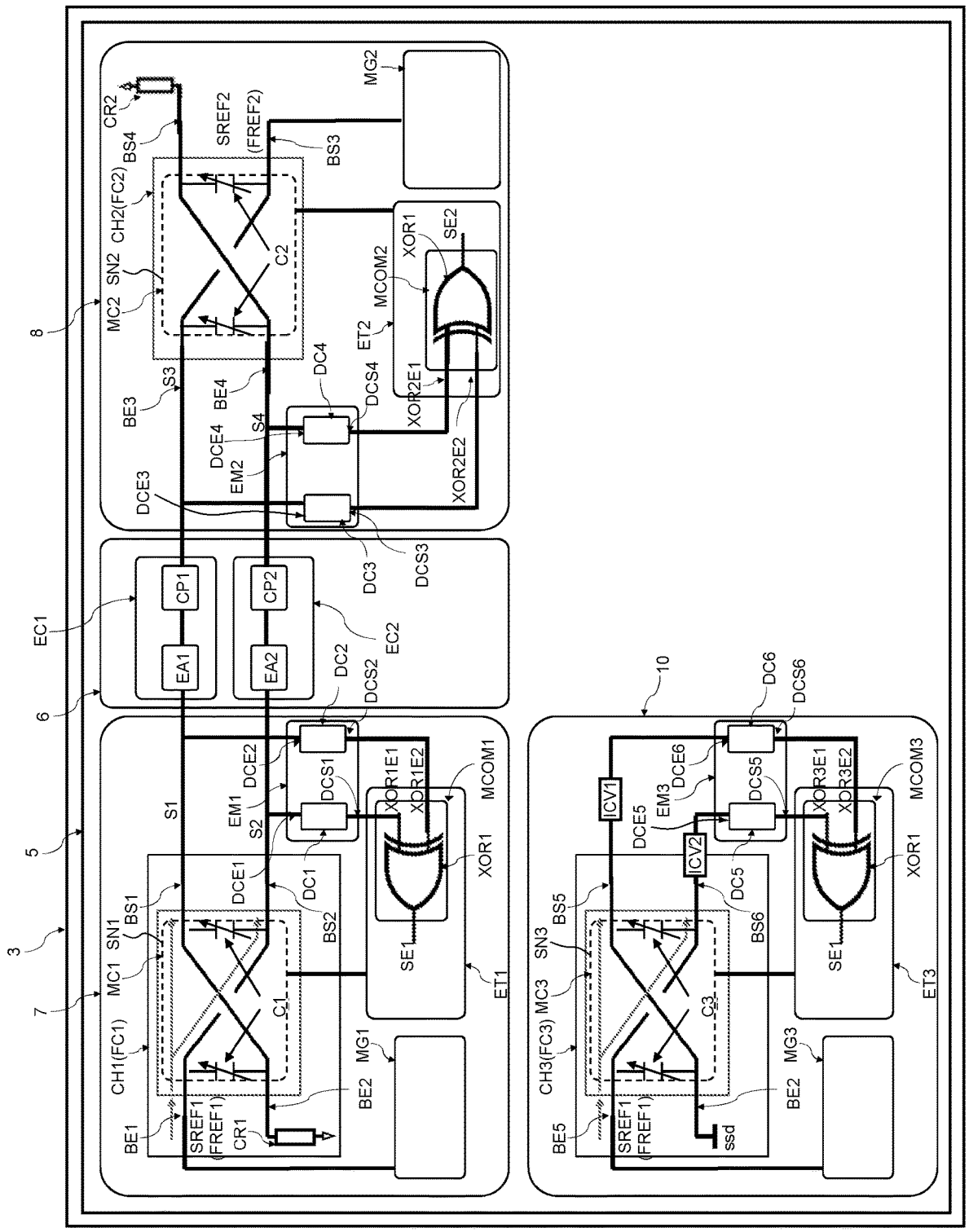
FIG. 5 illustrate another example embodiment of the transmission line.

Reference is now made to FIG. 5 in order to illustrate another example embodiment of the transmission line 3 comprising another structure 9 comprising at least two electronic devices which, in this case, for example, includes an input electronic device 7, an output electronic device 8 and a phase shifter electronic device 10 operating in phase shifter mode.

The electronic device 10 comprises a third generating circuit MG3, a third hybrid coupler CH3 operating in phase shifter mode, a third measuring circuit EM3 and a third processing circuit ET3.

The third generating circuit MG3 is configured for delivering a third reference signal SREF3 having a third reference frequency FREF3.

The third hybrid coupler CH3 which, in this case, for example, is a 90° quadrature hybrid coupler, comprises: a fifth input terminal BE5 coupled to the third generating circuit MG3 and configured to receive the third reference signal SREF3; a sixth input terminal BE6 configured to receive a phase shifted output signal SSD; a fifth output terminal BS5 coupled to the fifth measuring circuit EM5; a sixth output terminal BS6 coupled to the sixth measuring circuit EM6; and a third capacitive module MC3 having a third adjustable capacitive value C3 and coupled between the fifth and sixth input terminals BE5, BE6 and the fifth and sixth output terminals BS5, BS6.

The third capacitive module MC3 in this case comprises several configurations each one corresponding to a different capacitive value. The third capacitive module MC3 is in this case controlled by a digital signal SN3. The value of the digital signal SN3 corresponds to a specific configuration and consequently to a specific capacitive value.

The third measuring circuit EM3 comprises: a fifth peak detector DC5 whose input DCE5 is coupled to the fifth output terminal BS5 via a first variable complex impedance ICV1; and a sixth peak detector BS6 whose input DCE6 is coupled to the sixth output terminal BS6 via a second variable complex impedance ICV2.

The third processing circuit ET3 is coupled to the third capacitive module MC3 and comprises a third comparing circuit MCOM3 comprising: a third exclusive OR gate XOR3 of which a first input XOR3E1 is coupled to the output DCS5 of the fifth peak detector DC5 and of which a second input XOR3E2 is coupled to the output DCS6 of the sixth peak detector DC6.

The electronic input 7 and output 8 devices respectively comprise a same structure as the electronic phase shifting device 10. In other words, apart from what is shown in FIG. 2, the capacitive modules MC1, MC2 of the electronic input 7 and output 8 devices also comprise several configurations each one corresponding to a specific capacitive value and are controlled by corresponding digital signals SN1, SN2.

Reference is now made to FIG. 6 in order to illustrate diagrammatically an example implementation of a method for calibrating the real central frequencies FC1, FC2 and FC3 of the hybrid couplers CH1, CH2 and CH3.

A disconnectable coupling circuit 6 is coupled between the hybrid couplers CH1 and CH2.

The calibration method begins with an optional step ETP1_6, if one or more coupling circuits are present, intended for disconnecting the coupling circuit or circuits.

In the case of the structure 9 shown in FIG. 5, it is necessary to disconnect the coupling circuit 6 in step ETP1_6.

By way of non-limiting example, the calibration method in this case begins with a calibration of the central frequency of the third hybrid coupler CH3 operating in phase shifter mode.

In a step ETP2_6, the third generating circuit MG3 is configured for delivering, to the fifth output terminal BS5 of the third hybrid coupler CH3, a third reference signal SREF3 comprising a third reference frequency FREF3.

It is appropriate to note that the third reference frequency FREF3 is in this case the target frequency for the calibration of all three of the hybrid couplers since the structure of each hybrid coupler is identical.

On receiving the third reference signal SREF3 at the fifth input terminal BE5, the phase shifter hybrid coupler CH3 is configured for delivering a fifth signal S5 to the fifth output terminal BS5 and a sixth signal S6 to the sixth output terminal BS6.

When the real central frequency FC3 of the phase shifter hybrid coupler CH3 is equal to the third reference frequency FREF3, the maximum amplitudes, in other words the peak values VC5, VC6 of the fifth and sixth signals S5, S6, are equal.

In order to do this, the fifth and sixth peak detectors DC5, DC6 are configured for detecting the said peak values VC5, VC6.

The third exclusive OR gate XOR3 of the third processing circuit ET3 is configured to receive the peak values VC5, VC6 of the fifth and sixth signals S5, S6.

When these peak values VC5, VC6 are different, the third exclusive OR gate XOR3 is configured for delivering a third calibration signal SE3 in its high state. This third calibration signal SE3 serves in fact to indicate the state of calibration of the real central frequency FC3 of the phase shifter hybrid coupler CH3 (ETP3_6).

In order to align the real central frequency FC3 of the input hybrid coupler CH3 and the third reference frequency FREF3 to within a tolerance, for example of 5 to 10 mV, the third processing circuit ET3 is moreover configured for adjusting, in a step ETP4_6, the first capacitive value C3 of the third capacitive module MC3 in such a way as to vary the real central frequency FC3 of the phase shifter hybrid coupler CH3. This is done, for example, by an adjustment of the digital signal SN3 in order to change the configuration of the capacitive module MC3.

The adjustment ETP4_6 of the capacitive value C3 is carried out if the third calibration signal SE3 is in its high state and ends when the third calibration signal SE3 is in its low state (ETP5_6).

In this latter case, the real central frequency FC3 of the phase shifter hybrid coupler CH3 is equal to the third reference frequency FREF3 to within the tolerance.

The processing circuit ET3 of the phase shifter hybrid coupler CH3 is moreover configured for recording the current capacitive value C3C of the capacitive module MC3 or simply the current value of the digital signal SN3.

In a step ETP6_6, the processing circuit ET1, ET2 of each non-calibrated electronic device is configured for adjusting the corresponding capacitive value C1, C2 until the recorded capacitive value C3C of the capacitive module MC3 of the calibrated hybrid coupler CH3 is obtained.

As all of the hybrid couplers are structurally identical, their central frequencies FC1, FC2 are calibrated at the target frequency FREF3 once their capacitive values are adjusted to the recorded capacitive value C3C.

The invention is not limited to the embodiments that have just been described but includes all the variants.

The input and output electronic devices can be incorporated individually in different devices and the associated calibration phases (shown in FIGS. 3, 4 and 6) can also be implemented separately.

The invention claimed is:

1. A method for calibrating a central frequency of a hybrid coupler operating in a power divider mode, wherein the hybrid coupler comprises two inputs, two outputs, a capacitive module coupled between the two inputs and the two outputs or coupled on said two inputs and said two outputs, wherein the capacitive module has an adjustable capacitive value which adjusts the central frequency, the method comprising:
    delivering a reference signal having a reference frequency on a first input of said two inputs of the hybrid coupler;
    measuring the peak value of a first signal delivered to a first output of said two outputs of the hybrid coupler;
    measuring the peak value of a second signal delivered to a second output of said two outputs of the hybrid coupler;
    comparing the peak values of the first and second signals; and
    adjusting the adjustable capacitive value of the capacitive module until an equality of the peak values of the first and second signals is obtained to within a tolerance.

2. The method according to claim 1, wherein the hybrid coupler is a 90° hybrid coupler.

3. A method for calibrating a central frequency of a hybrid coupler operating according to a power combiner mode, wherein the hybrid coupler comprises two inputs, two outputs, a capacitive module coupled between the two inputs and the two outputs or on the two inputs and the two outputs, the capacitive module having an adjustable capacitive value making it possible to adjust the central frequency, the method comprising:
    delivering a reference signal having a reference frequency on a first output of said two outputs of the hybrid coupler;
    measuring the peak value of a first signal delivered to a first input of said two inputs of the hybrid coupler;
    measuring the peak value of a second signal delivered to a second input of said two inputs of the hybrid coupler;
    comparing the peak values of the first and second signals; and
    adjusting the adjustable capacitive value of the capacitive module until an equality of the peak values of the first and second signals is obtained to within a tolerance.

4. The method according to claim 3, wherein the hybrid coupler is a 90° hybrid coupler.

5. A method for calibrating a central frequency of a hybrid coupler operating according to a phase shifter mode, wherein the hybrid coupler comprises two inputs, two outputs, a capacitive module coupled between the two inputs and the two outputs or on the two inputs and the two outputs, the capacitive module having an adjustable capacitive value making it possible to adjust the central frequency, the method comprising:
    delivering a reference signal having a reference frequency on a first input of said two inputs of the hybrid coupler;
    measuring the peak value of a first signal delivered to a first output of said two outputs of the hybrid coupler;
    measuring the peak value of a second signal delivered to a second input of said two inputs of the hybrid coupler;
    comparing the peak values of the first and second signals; and
    adjusting the adjustable capacitive value of the capacitive module until an equality of the peak values of the first and second signals is obtained to within a tolerance.

6. The method according to claim 5, wherein the hybrid coupler is a 90° hybrid coupler.

7. A method for calibrating a structure comprising an input hybrid coupler operating in a power divider mode, an output hybrid coupler operating in a power combiner mode and a disconnectable coupling stage coupled between the input hybrid coupler and the output hybrid coupler, the method comprising:
    disconnecting the disconnectable coupling stage;
    after disconnecting, performing a calibration of a central frequency of the input hybrid coupler by:
        delivering a first reference signal having a first reference frequency on a first input of the input hybrid coupler;
        measuring the peak value of a first signal delivered to a first output of the input hybrid coupler;
        measuring the peak value of a second signal delivered to a second output of the input hybrid coupler;
        comparing the peak values of the first and second signals; and
        adjusting an adjustable capacitive value of a capacitive module coupled between the first input and the first and second outputs of the input first hybrid coupler or on the first input and the first and second outputs of the input first hybrid coupler until an equality of the peak values of the first and second signals is obtained to within a tolerance; and
    after disconnecting, performing a calibration of a central frequency of the output hybrid coupler by:

delivering a second reference signal having a second reference frequency on a first output of the output hybrid coupler;

measuring the peak value of a third signal delivered to a first input of the output hybrid coupler;

measuring the peak value of a fourth signal delivered to a second input of the output hybrid coupler;

comparing the peak values of the third and fourth signals; and adjusting the adjustable capacitive value of the capacitive module until an equality of the peak values of the third and fourth signals is obtained to within a further tolerance.

8. The method according to claim 7, wherein the input and output hybrid couplers are each a 90° hybrid coupler.

9. A method for calibrating a structure comprising two hybrid couplers of identical structure which are able to operate according to one of identical modes or different modes, the method comprising:

performing a first calibration of a central frequency of one of the two hybrid couplers by:

delivering a reference signal having a reference frequency on a first input of said one of two hybrid couplers;

measuring the peak value of a first signal delivered to a first output of said one of two hybrid couplers;

measuring the peak value of a second signal delivered to a second output of said one of two hybrid couplers;

comparing the peak values of the first and second signals; and adjusting an adjustable capacitive value of a capacitive module coupled between the first input and the first and second outputs of said one of two hybrid couplers or on the first input and the first and second outputs of said one of two hybrid couplers until an equality of the peak values for the first and second signals is obtained to within a tolerance;

recording the adjustable capacitive value of the capacitive module of said one of two hybrid couplers calibrated at the end of the first calibration; and adjusting a capacitive module of the other one of the two hybrid couplers with the recorded capacitive value.

10. The method of claim 9, wherein the structure further includes one or more disconnectable coupling stages coupled between the two hybrid couplers, the method further comprising performing, prior to any steps of claim 9, a disconnection of the coupling stage.

11. The method according to claim 9, wherein each of the two hybrid couplers is a 90° hybrid coupler.

12. A method for calibrating a structure comprising two hybrid couplers of identical structure which are able to operate according to one of identical modes or different modes, the method comprising:

performing a first calibration of a central frequency of one of the two hybrid couplers by:

delivering a reference signal having a reference frequency on a first output of said one of the two hybrid couplers;

measuring the peak value of a first signal delivered to a first input of said one of the two hybrid couplers;

measuring the peak value of a second signal delivered to a second input of said one of the two hybrid couplers;

comparing the peak values of the first and second signals; and adjusting the adjustable capacitive value of a capacitive module coupled between the first and second inputs and the first output of said one of two hybrid couplers until an equality of the peak values of the first and second signals is obtained to within a tolerance;

recording the adjustable capacitive value of the capacitive module of said one of two hybrid couplers calibrated at the end of the first calibration; and adjusting a capacitive module of the other one of the two hybrid couplers with the recorded capacitive value.

13. The method of claim 12, wherein the structure further includes one or more disconnectable coupling stages coupled between the two hybrid couplers, the method further comprising performing, prior to any steps of claim 12, a disconnection of the coupling stage.

14. The method according to claim 12, wherein each of the two hybrid couplers is a 90° hybrid coupler.

15. A method for calibrating a structure comprising two hybrid couplers of identical structure which are able to operate according to one of identical modes or different modes, the method comprising:

performing a first calibration of a central frequency of one of the two hybrid couplers by:

delivering a reference signal having a reference frequency on a first input of one of said two hybrid couplers;

measuring the peak value of a first signal delivered to a first output of said one of said two hybrid couplers;

measuring the peak value of a second signal delivered to the second input of said one of said two hybrid couplers;

comparing the peak values of the first and second signals; and adjusting the adjustable capacitive value of a capacitive module coupled between the first and second inputs and the first output of said one of two hybrid couplers or on the first and second inputs and the first output of said one of two hybrid couplers until an equality of the peak values is obtained to within a tolerance;

recording the adjustable capacitive value of the capacitive module of said one of two hybrid couplers calibrated at the end of the first calibration; and adjusting a capacitive module of the other one of the two hybrid couplers with the recorded capacitive value.

16. The method of claim 15, wherein the structure further includes one or more disconnectable coupling stages coupled between the two hybrid couplers, the method further comprising performing, prior to any steps of claim 15, a disconnection of the coupling stage.

17. The method according to claim 15, wherein each of the two hybrid couplers is a 90° hybrid coupler.

18. An electronic device, comprising:

a hybrid coupler operating according to a power divider mode and comprising two inputs, two outputs, a capacitive module that is coupled between the two inputs and the two outputs or on the two inputs and two outputs, the capacitive module having an adjustable capacitive value making it possible to adjust a central frequency of the hybrid coupler, wherein a first input of said two inputs of the hybrid coupler is configured to receive a reference signal having a reference frequency;

a measuring circuit configured to measure the peak value of a first signal delivered to a first output of said two outputs of the hybrid coupler and measure the peak value of a second signal delivered to a second output of said two outputs of the hybrid coupler; and a processing circuit configured to compare the peak values of the first and second signals and adjust the adjustable capacitive value of the capacitive module until an equality of the peak values is obtained to within a tolerance.

19. The device according to claim 18, wherein the measuring circuit comprises a first peak detector configured to measure the peak value of the first signal and a second peak detector configured to measure the peak value of the second signal.

20. The device according to claim 18, wherein the processing stage comprises a comparison circuit configured to compare the peak values of the first and second signals.

21. The device according to claim 20, wherein the comparison circuit comprises an exclusive OR gate.

22. The device according to claim 18, wherein the capacitive module is configurable to provide a plurality of different capacitive values.

23. The device according to claim 18, produced in an integrated manner.

24. An electronic device, comprising:
a hybrid coupler operating according to a power combiner mode and comprising two inputs, two outputs, a capacitive module coupled between the two inputs and the two outputs or on the two inputs and two outputs, the capacitive module having an adjustable capacitive value making it possible to adjust a central frequency of the hybrid coupler, a first output of said two outputs of the hybrid coupler configured to receive a reference signal having a reference frequency;
a measuring circuit configured to measure the peak value of a first signal delivered to a first input of said two inputs of the hybrid coupler and measure the peak value of a second signal delivered to a second input of said two inputs of the hybrid coupler; and
a processing circuit configured to compare the peak values of the first and second signals and adjust the adjustable capacitive value of the capacitive module until an equality of the peak values is obtained to within a tolerance.

25. The device according to claim 24, wherein the measuring circuit comprises a first peak detector configured to measure the peak value of the first signal and a second peak detector configured to measure the peak value of the second signal.

26. The device according to claim 24, wherein the processing stage comprises a comparison circuit configured to compare the peak values of the first and second signals.

27. The device according to claim 26, wherein the comparison circuit comprises an exclusive OR gate.

28. The device according to claim 24, wherein the capacitive module is configurable to provide a plurality of different capacitive values.

29. The device according to claim 24, produced in an integrated manner.

30. An electronic device, comprising:
a hybrid coupler operating according to a phase shifter mode and comprising two inputs, two outputs, a capacitive module coupled between the two inputs and the two outputs or on the two inputs and two outputs, the capacitive module having an adjustable capacitive value making it possible to adjust a central frequency of the hybrid coupler, a first input of said two inputs of the hybrid coupler configured to receive a reference signal having a reference frequency;
a measuring circuit configured to measure the peak value of a first signal delivered to a first output of said two outputs of the hybrid coupler and the peak value of a second signal delivered to a second input of said two inputs of the hybrid coupler; and
a processing circuit configured to compare the peak values of the first and second signals and adjust the adjustable capacitive value of the capacitive module until an equality of the peak values is obtained to within a tolerance.

31. The device according to claim 30, wherein the measuring circuit comprises a first peak detector configured to measure the peak value of the first signal and a second peak detector configured to measure the peak value of the second signal.

32. The device according to claim 30, wherein the processing stage comprises a comparison circuit configured to compare the peak values of the first and second signals.

33. The device according to claim 32, wherein the comparison circuit comprises an exclusive OR gate.

34. The device according to claim 30, wherein the capacitive module is configurable to provide a plurality of different capacitive values.

35. The device according to claim 30, produced in an integrated manner.

36. A structure, comprising:
an input device comprising:
a first hybrid coupler operating according to a power divider mode and comprising two inputs, two outputs, a first capacitive module that is coupled between the two inputs and the two outputs or on the two inputs and two outputs, the first capacitive module having an adjustable capacitive value making it possible to adjust a central frequency of the first hybrid coupler, wherein a first input of said two inputs of the first hybrid coupler is configured to receive a first reference signal having a first reference frequency;
a measuring circuit configured to measure the peak value of a first signal delivered to a first output of said two outputs of the first hybrid coupler and measure the peak value of a second signal delivered to a second output of said two outputs of the first hybrid coupler; and
a processing circuit configured to compare the peak values of the first and second signals and adjust the adjustable capacitive value of the first capacitive module until an equality of the peak values is obtained to within a tolerance;
an output device comprising:
a second hybrid coupler operating according to a power combiner mode and comprising two inputs, two outputs, a second capacitive module coupled between the two inputs and the two outputs or on the two inputs and two outputs, the second capacitive module having an adjustable capacitive value making it possible to adjust a central frequency of the second hybrid coupler, a first output of said two outputs of the second hybrid coupler configured to receive a second reference signal having a second reference frequency;
a measuring circuit configured to measure the peak value of a third signal delivered to a first input of said two inputs of the second hybrid coupler and measure the peak value of a fourth signal delivered to a second input of said two inputs of the second hybrid coupler; and
a processing circuit configured to compare the peak values of the third and fourth signals and adjust the adjustable capacitive value of the capacitive module until an equality of the peak values is obtained to within a tolerance; and a disconnectable coupling stage coupled between the first hybrid coupler of the input electronic device and the second hybrid coupler of the output electronic device, said disconnectable coupling stage configured to be disconnected before the input device and the output device are respectively configured for adjusting the central frequency of the corresponding first and second hybrid couplers by adjusting the adjustable capacitive value of the corresponding first and second capacitive modules.

37. The structure of claim 36, wherein the structure is a component of a communication device.

38. A structure, comprising:
a first electronic device comprising:
   a first hybrid coupler operating according to an operating mode and comprising two inputs, two outputs, a first capacitive module that is coupled between the two inputs and the two outputs or on the two inputs and two outputs, the capacitive module having an adjustable capacitive value making it possible to adjust a central frequency of the first hybrid coupler;
a second electronic device, comprising:
   a second hybrid coupler operating according to an operating mode and comprising two inputs, two outputs, a second capacitive module that is coupled between the two inputs and the two outputs or on the two inputs and two outputs, the capacitive module having an adjustable capacitive value making it possible to adjust a central frequency of the second hybrid coupler;
wherein the operating modes of the first and second electronic devices are either identical operating modes or different operating modes; and a disconnectable coupling stage coupled between the first and second electronic devices, said disconnectable coupling stage configured to be disconnected before the input electronic device and the output electronic device are respectively configured for adjusting the central frequency of the corresponding first and second hybrid couplers by adjusting the adjustable capacitive value of the corresponding first and second capacitive modules; and wherein one of the first and second electronic devices is configured to record the adjustable capacitive value for one of the first and second capacitive modules of said one of the first and second electronic device; and wherein the other of the first and second electronic devices is configured to have the adjustable capacitive value for the other of the first and second capacitive modules of said other of the first and second electronic device adjusted with the recorded capacitive value; and wherein said one of the first and second electronic devices further comprises:
   a measuring circuit configured to measure the peak value of a first signal delivered to a first output of said two outputs of one of the first and second hybrid couplers and measure the peak value of a second signal delivered to a second output of said two outputs of said one of the first and second hybrid couplers; and
   a processing circuit configured to compare the peak values of the first and second signals and adjust the adjustable capacitive value for said one of the first and second capacitive modules until an equality of the peak values is obtained to within a tolerance.

39. The structure of claim 38, wherein the structure is a component of a communication device.

* * * * *